(12) United States Patent
Aochi

(10) Patent No.: US 6,815,768 B1
(45) Date of Patent: Nov. 9, 2004

(54) SEMICONDUCTOR INTEGRATED CIRCUIT DEVICE INCORPORATING MEMORY CELL TRANSISTOR AND LOGIC TRANSISTOR, AND METHOD OF MANUFACTURING THE SAME

(75) Inventor: Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/699,202

(22) Filed: Oct. 31, 2003

(30) Foreign Application Priority Data

Apr. 24, 2003 (JP) ..................... 2003-120098

(51) Int. Cl.⁷ .............................. H01L 29/72
(52) U.S. Cl. ............... 257/330; 257/282; 257/336; 257/380; 257/392; 438/217; 438/276; 438/289
(58) Field of Search .............. 257/330, 282, 257/336, 380, 392; 438/217, 276, 289

(56) References Cited

U.S. PATENT DOCUMENTS 6,339,237 B1 * 1/2002 Nomachi et al. ........... 257/282

FOREIGN PATENT DOCUMENTS

JP 2000-232076 8/2000

* cited by examiner

Primary Examiner—Edward Wojciechowicz
(74) Attorney, Agent, or Firm—Frommer Lawrence & Haug LLP

(57) ABSTRACT

A conductor film and a cap insulating film are sequentially formed, and a laminated film constituted of the cap insulating film and the conductor film is patterned, and then a gate electrode is formed. Next, source and drain diffusion regions are formed, and a first silicon nitride film is formed on a sidewall of the laminated film, and then a second silicon nitride film is formed on an entire surface, and further a silicon oxide film is deposited. Next, the silicon oxide film is left between the gate electrodes, and the second silicon nitride film on the laminated film is removed, and the cap insulating film left above the gate electrode is removed, and a metal silicide film is formed on a surface of the gate electrode, and then a third silicon nitride film is left on the gate electrode.

13 Claims, 9 Drawing Sheets

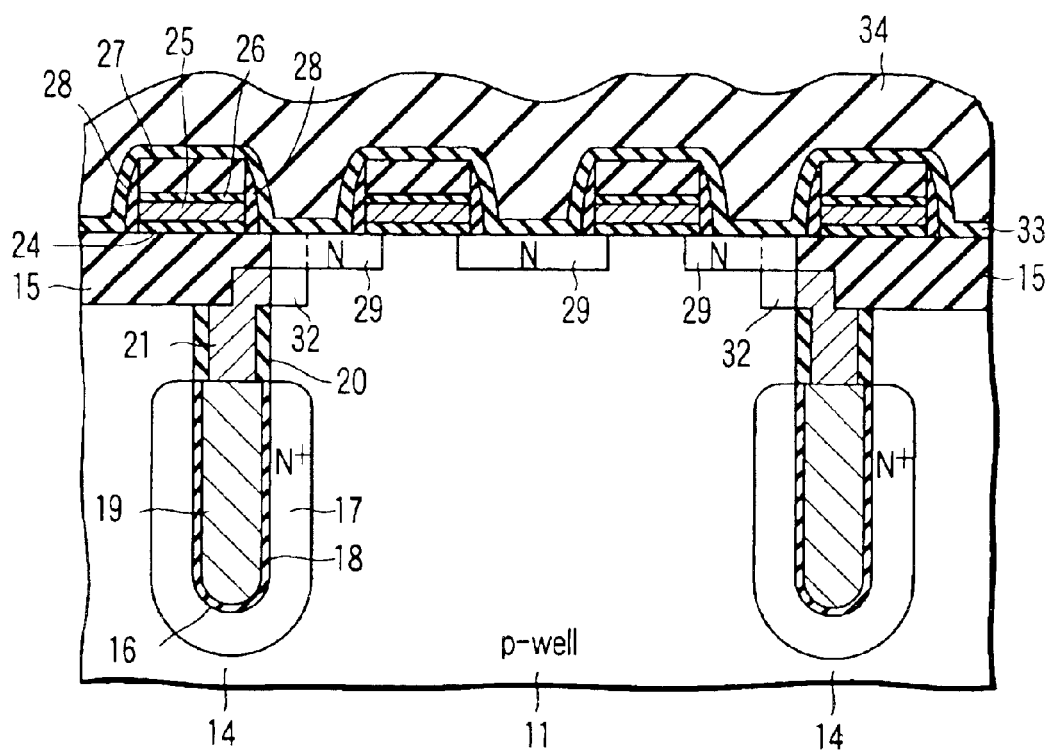
F I G. 4A
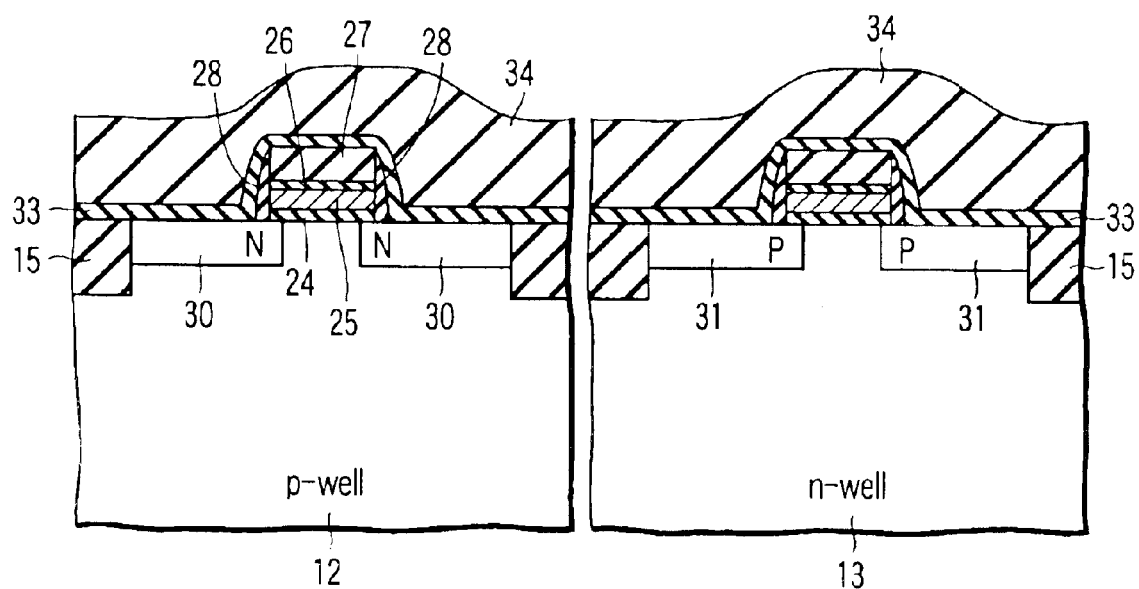
F I G. 4B

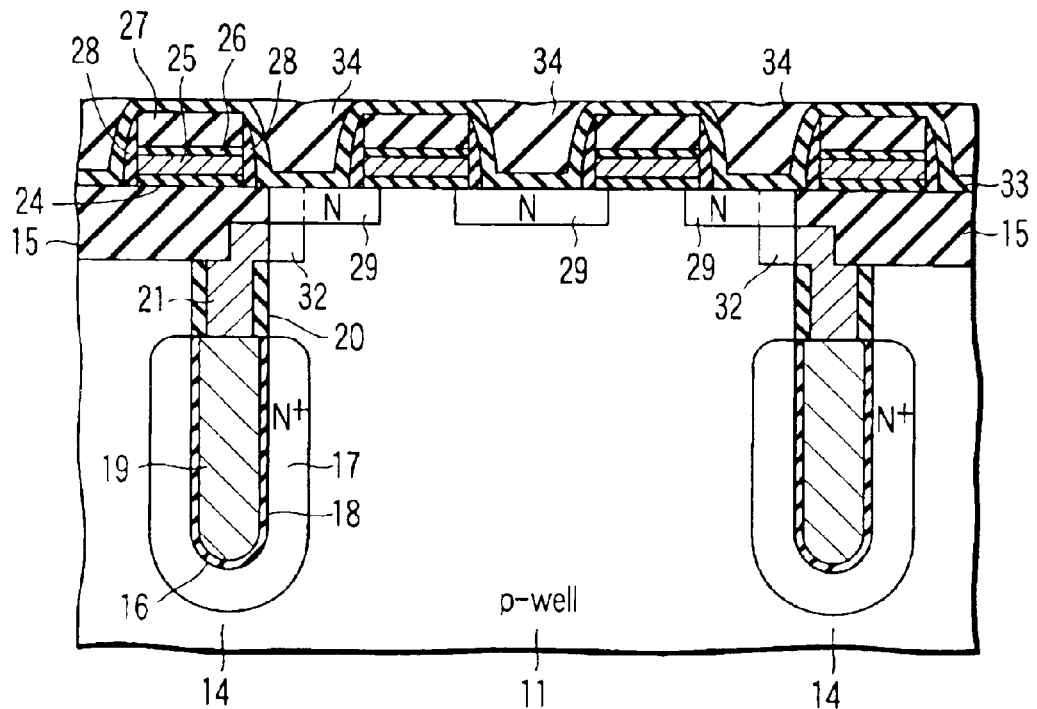
F I G. 5A
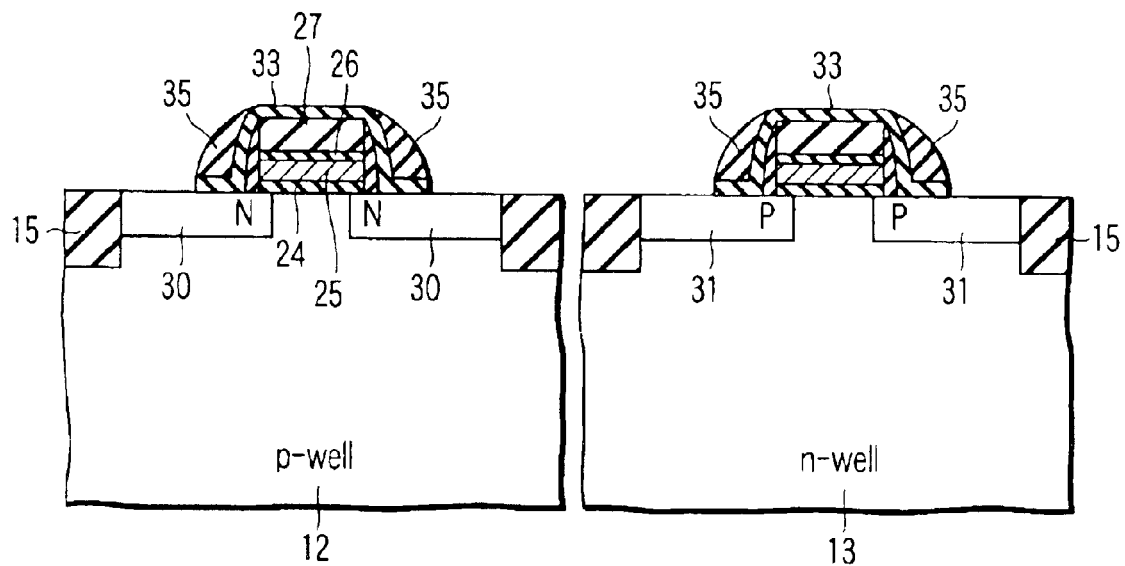
F I G. 5B

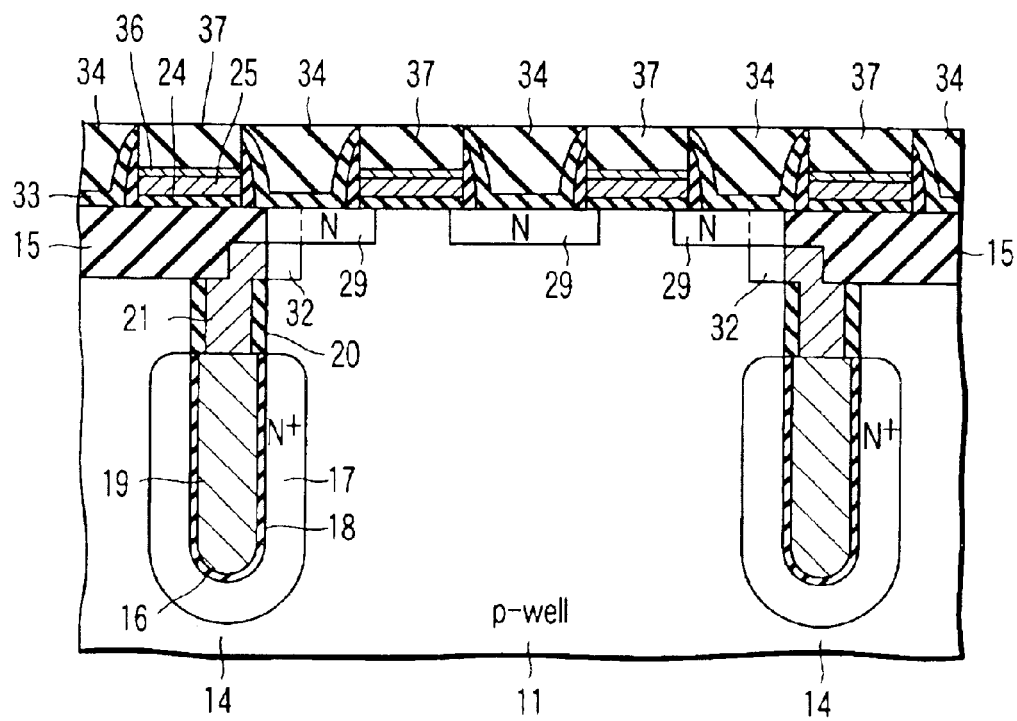
F I G. 8A
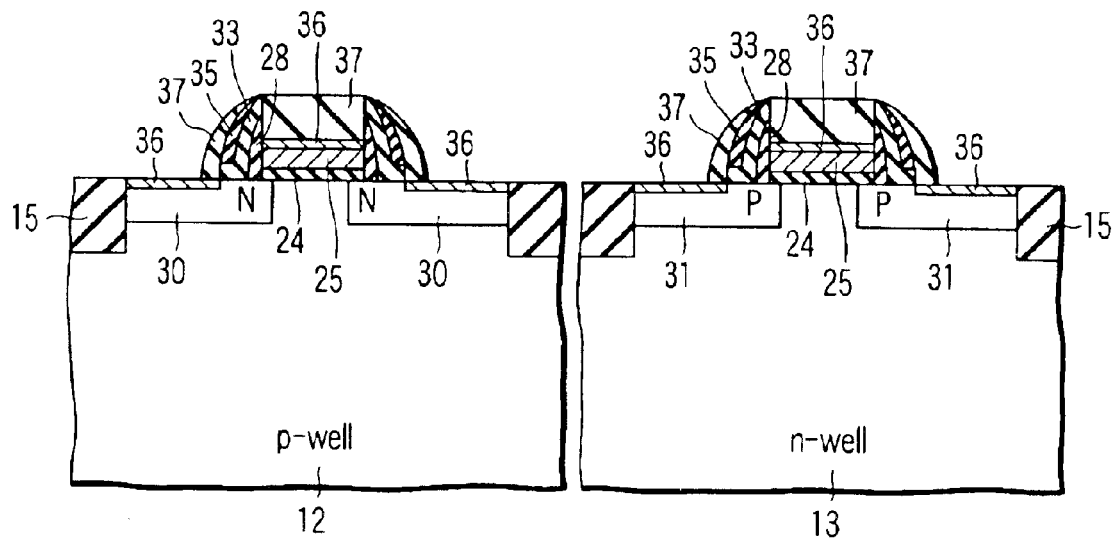
F I G. 8B

SEMICONDUCTOR INTEGRATED CIRCUIT DEVICE INCORPORATING MEMORY CELL TRANSISTOR AND LOGIC TRANSISTOR, AND METHOD OF MANUFACTURING THE SAME

CROSS-REFERENCE TO RELATED APPLICATIONS

This application is based upon and claims the benefit of priority from the prior Japanese Patent Application No. 2003-120098, filed Apr. 24, 2003, the entire contents of which are incorporated herein by reference.

BACKGROUND OF THE INVENTION

1. Field of the Invention

This invention relates to a semiconductor integrated circuit device and a method of manufacturing the same, and more particularly, it relates to a semiconductor integrated circuit device incorporating a DRAM in which a memory cell transistor and a logic transistor are integrated on the same semiconductor substrate, and a method of manufacturing the same.

2. Description of the Related Art

Generally in a semiconductor integrated circuit device incorporating a DRAM, metal silicide is formed on a gate electrode by a self-aligned silicidation process. It is thus impossible to form a cap insulating film such as a silicon nitride film on the gate electrode, giving a disadvantage that a self-aligned contact cannot be used which forms a contact self-aligningly with the gate electrode of a memory cell transistor.

Therefore, as has been conventionally known, for example, Jpn. Pat. Appln. KOKAI Publication No. 2000-232076 describes a semiconductor integrated circuit device incorporating a DRAM wherein metal silicide is formed respectively on source and drain regions and on the gate electrode of a logic transistor, and on the gate electrode of the memory cell transistor so as to achieve high-speed operation, and a sidewall insulating film is formed between the memory cell transistors so as to form a self-aligned contact with the gate electrode of the memory cell transistor.

However, gate processing is carried out individually for the memory cell transistor and logic transistor in the one described in the above document, which leads to a disadvantage of complicated manufacturing processes.

It is therefore desired that metal silicide is formed respectively on the source and drain regions and on the gate electrode of the logic transistor, and on the gate electrode of the memory cell transistor so as to achieve high-speed operation, and that the self-aligned contact can be formed with the gate electrode of the memory cell transistor, and further that the gate processing is carried out simultaneously for the logic transistor and memory cell transistor to reduce the number of manufacturing processes.

BRIEF SUMMARY OF THE INVENTION

According to one aspect of the present invention, there is provided a method of manufacturing a semiconductor integrated circuit device comprises: sequentially forming a gate insulating film, a conductor film containing silicon, and a cap insulating film containing a member capable of selectively etching a silicon nitride film in each of a first silicon semiconductor region and a second silicon semiconductor region; patterning a laminated film constituted of the cap insulating film and the conductor film to form a gate electrode in each of the first and second silicon semiconductor regions; using the laminated film as a mask for introducing impurity to selectively introduce the impurity so as to form source and drain diffusion regions in each of the first and second silicon semiconductor regions; forming a first silicon nitride film on a sidewall of each of the laminated films; forming a second silicon nitride film on an entire surface; depositing a first insulating film on the entire surface, and then leaving the first insulating film between the gate electrodes in the first silicon semiconductor region; depositing a second insulating film in the second silicon semiconductor region, and then leaving the second insulating film on a sidewall of each of the laminated films in the second silicon semiconductor region; removing the second silicon nitride film on each of the laminated films and the second silicon nitride film left on a surface of the second silicon semiconductor region; removing the cap insulating film left above each of the gate electrodes; forming a metal silicide film on a surface of the conductor film of each of the gate electrodes and forming a metal silicide film on each surface of the source and drain diffusion regions formed in the second silicon semiconductor region; and depositing a third silicon nitride film on the entire surface, and then leaving the third silicon nitride film on each of the gate electrodes.

According to another aspect of the present invention, there is provided a semiconductor integrated circuit device comprises: a pair of first gate electrodes including a conductor film which are each provided via a gate insulating film in a first silicon semiconductor region; a first diffusion region provided in the first silicon semiconductor region between the pair of first gate electrodes; first metal silicide films provided on upper surfaces of the pair of first gate electrodes respectively; first silicon nitride films provided on the pair of first gate electrodes respectively; second silicon nitride films provided respectively on sidewalls of a laminated film constituted of the pair of first gate electrodes and the first silicon nitride films; a third silicon nitride film provided on the second silicon nitride film so that the first diffusion region is exposed in a flat portion positioned between the pair of first gate electrodes; a self-aligned contact provided between the pair of first gate electrodes and electrically connected to the diffusion region; a second gate electrode including a conductor film which is formed in a second silicon semiconductor region via a gate insulating film; a pair of second diffusion regions formed in the second silicon semiconductor region positioned on both surfaces of the second gate electrode; a second metal silicide film formed on an upper surface of the second gate electrode; a fourth silicon nitride film provided on the second gate electrode; a fifth silicon nitride film provided on a sidewall of a laminated film constituted of the second gate electrode and the fourth silicon nitride film; a sixth silicon nitride film provided on the fifth silicon nitride film so as to extend onto a portion of the surface of the pair of second diffusion regions; third metal silicide films provided respectively on the surfaces of the pair of second diffusion regions which are not covered with the sixth silicon nitride film; an insulating film provided on the sixth silicon nitride film; and a seventh silicon nitride film provided on the insulating film.

BRIEF DESCRIPTION OF THE SEVERAL VIEWS OF THE DRAWING

FIG. 4A and FIG. 4B are sectional views showing a manufacturing process following FIG. 3A and FIG. 3B;

FIG. 5A and FIG. 5B are sectional views showing a manufacturing process following FIG. 4A and FIG. 4B;

FIG. 8A and FIG. 8B are sectional views showing a manufacturing process following FIG. 7A and FIG. 7B.

DETAILED DESCRIPTION OF THE INVENTION

An embodiment of the invention will hereinafter be described in detail with reference to the drawings.

FIG. 1A, FIG. 1B to FIG. 9A, FIG. 9B are sectional views sequentially showing manufacturing processes wherein the invention is applied to a semiconductor integrated circuit device in which a DRAM memory cell, and a logic transistor including P-channel and N-channel transistors are integrated on the same semiconductor substrate.

It should be noted that throughout the drawings, A of each drawing shows a region (first region) where the DRAM memory cell is formed, and B of each drawing shows a region (second region) where the logic transistor is formed and shows the manufacture of the N-channel transistor on a left side of the second region and the manufacture of the P-channel transistor on a right side.

Figure 1A:
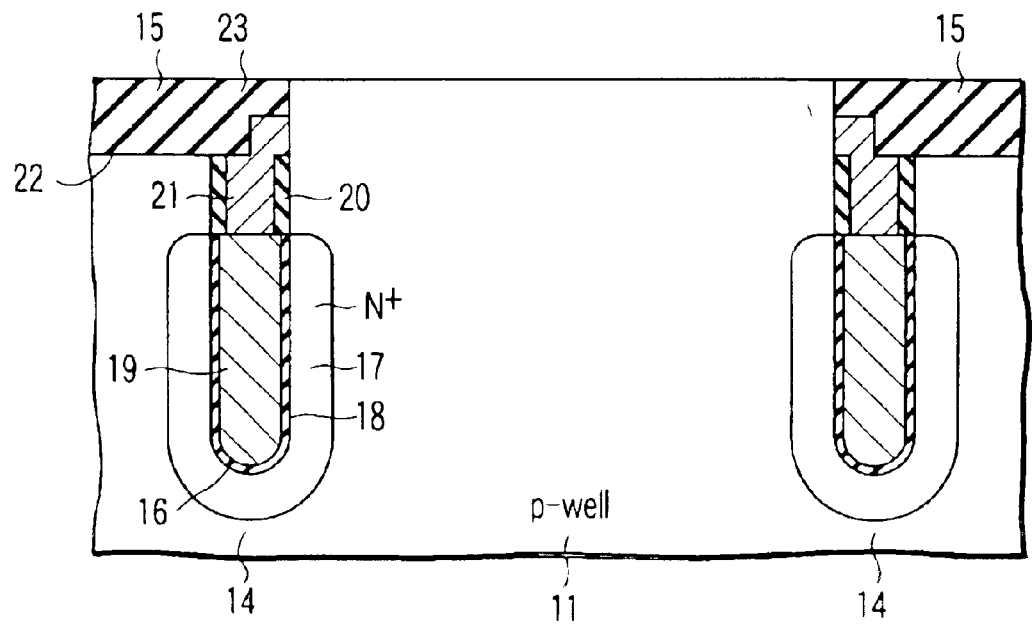
FIG. 1A and FIG. 1B are sectional views showing an initial manufacturing process of a method of manufacturing a semiconductor integrated circuit device according to one embodiment of the invention.
Figure 1B:
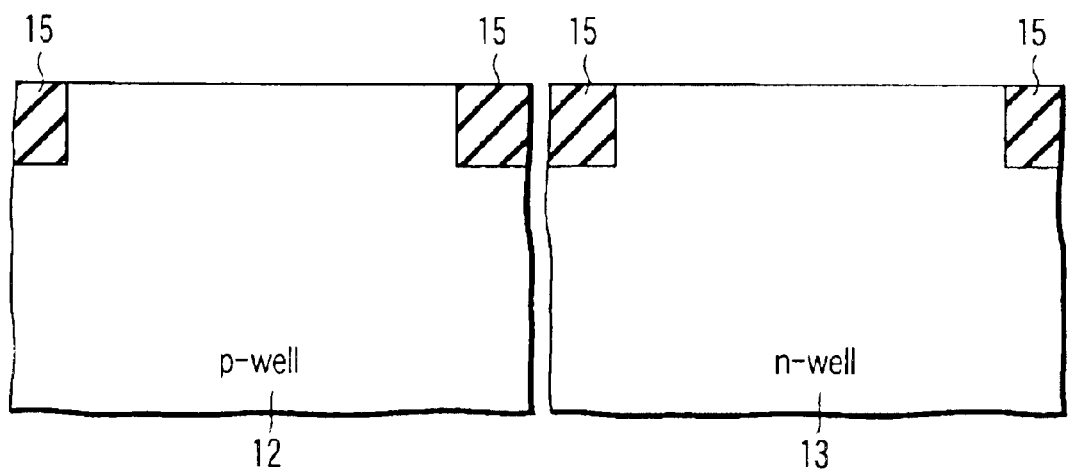

First, as shown in FIG. 1A, FIG. 1B, a p-well region 11 is formed on a silicon semiconductor substrate in the first region, and a p-well region 12 and an n-well region 13 are formed on the silicon semiconductor substrate in the second region.

Next, a plurality of trench capacitors 14 are formed at predetermined intervals in the first region by a known method, and in the first and second regions, isolation regions 15 are formed by an STI (shallow trench isolation) process.

The trench capacitors 14 are formed, for example, in the following manner. A deep trench 16 is formed in the p-well region 11 by a selective etching technique. An n-type impurity is diffused from inside the trench 16 in the p-well region 11 to form an $N^+$-type embedded plate electrode 17. A dielectric film 18 for the capacitor is formed on an inner surface of the trench 16. For example, a so-called ON film constituted of a silicon oxide film and a silicon nitride film is utilized as the dielectric film 18. A polycrystalline silicon film 19 doped with the n-type impurity is next embedded about halfway into the trench 16. Further, a silicon oxide film 20 called color oxide is formed on a peripheral surface in an upper portion of the trench 16. A polycrystalline silicon film 21 doped with the n-type impurity is embedded into the vicinity of an upper portion of the trench 16. Subsequently, a shallow trench 22 for the STI is formed, and an insulating film 23 is embedded inside the trench 22, thereby forming the isolation region 15. A shallow trench is formed also in the second region at the same time when the trench 22 is formed, and subsequently an insulating film is embedded in the trench to form the isolation region 15.

Figure 2A:
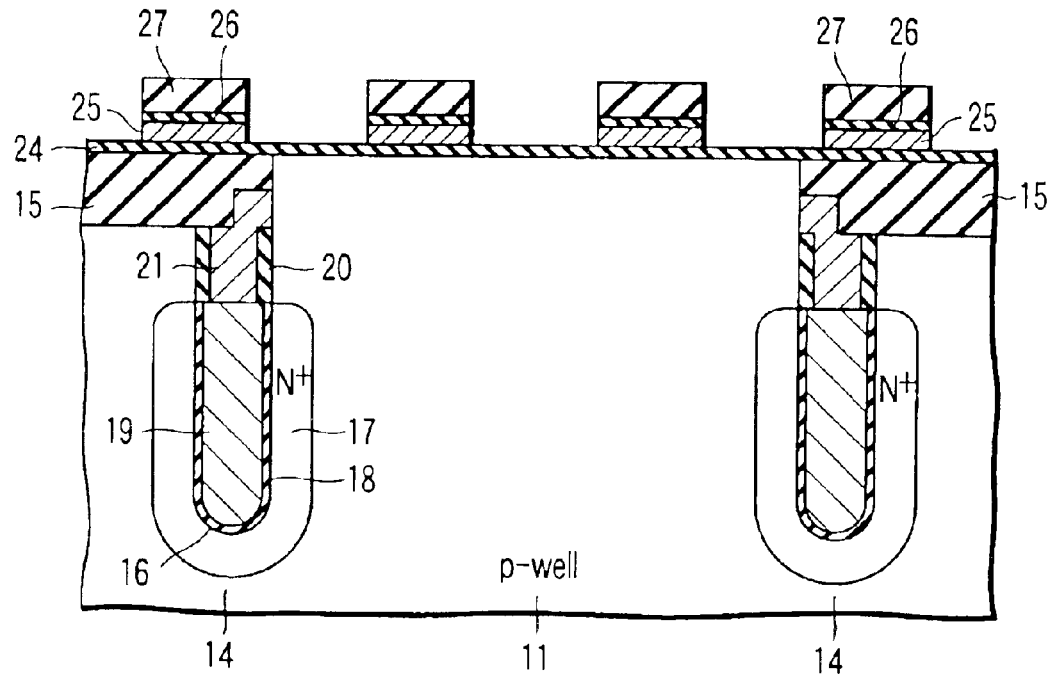
FIG. 2A and FIG. 2B are sectional views showing a manufacturing process following FIG. 1A and FIG. 1B.
Figure 2B:
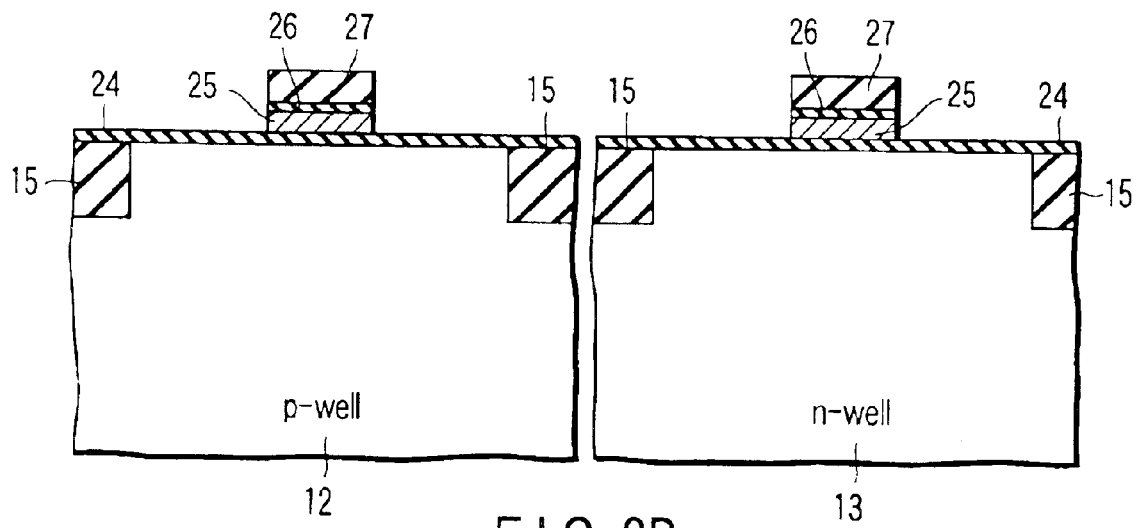

Next, as shown in FIG. 2A, FIG. 2B, a gate oxide film 24 is formed on an entire surface by a thermal oxidation method, and then a polycrystalline silicon film into which impurity is introduced is deposited, for example, with a film thickness of 100 nm, on which a thermally-oxidized film, a CVD (chemical vapor deposition) silicon oxide film 26, and a cap insulating film 27 made of a material such as a silicon oxide film capable of selectively etching the silicon nitride film are sequentially deposited so as to form a laminated film. Subsequently, the laminated film is patterned by RIE (reactive ion etching) using a resist pattern, and a gate electrode 25 made of a polycrystalline silicon film is formed on the first and second regions.

Here, when the gate electrode 25 is formed, a space between the gate electrodes formed in the second region is formed to be wider than a space between the gate electrodes formed in the first region.

Figure 3A:
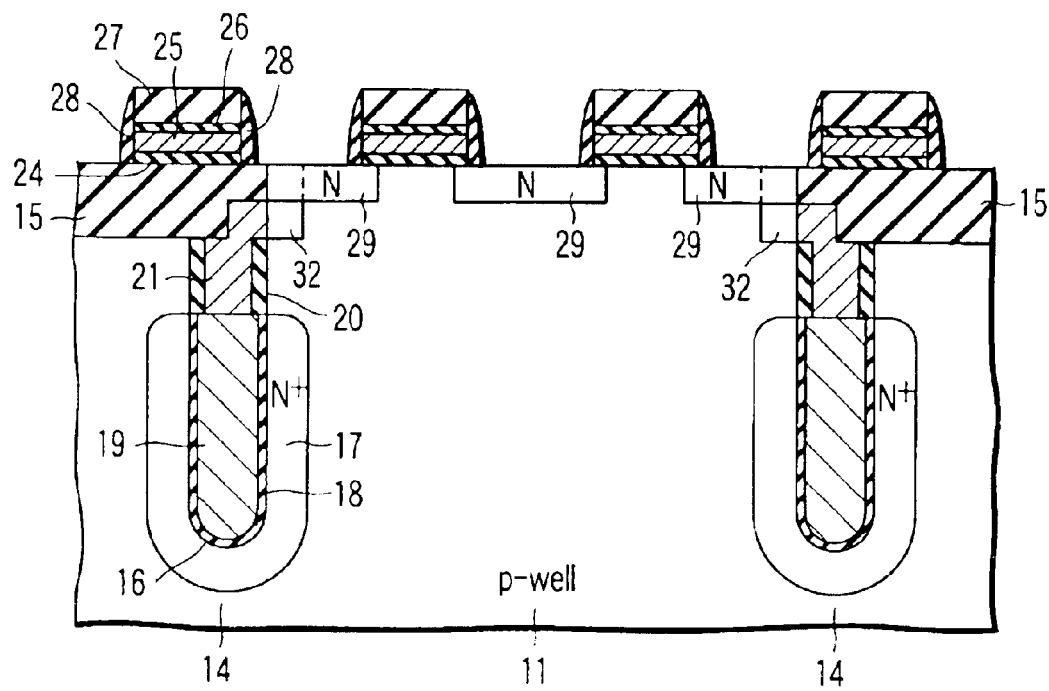
FIG. 3A and FIG. 3B are sectional views showing a manufacturing process following FIG. 2A and FIG. 2B.
Figure 3B:
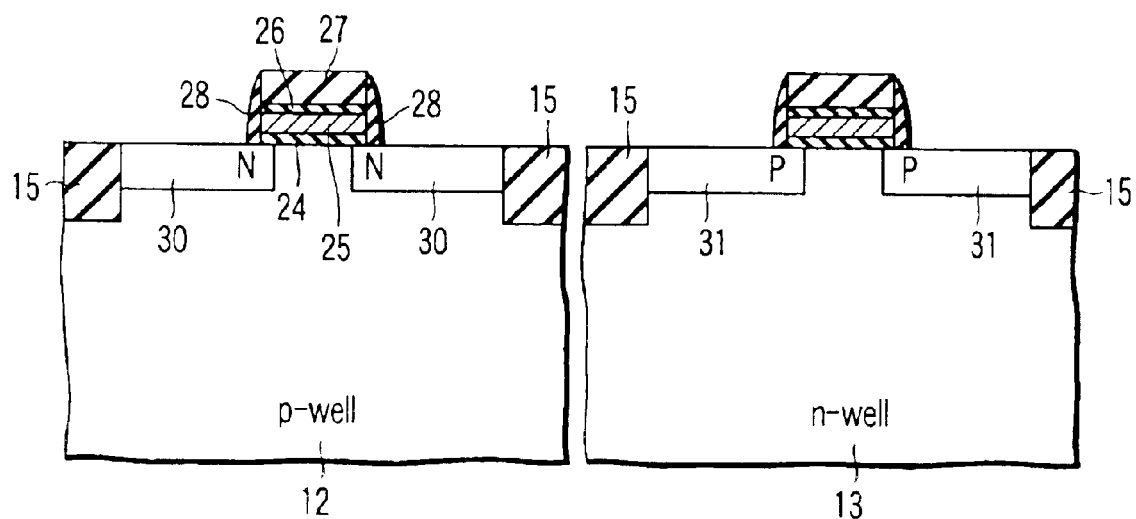

Next, as shown in FIG. 3A, FIG. 3B, a sidewall of the patterned laminated film is oxidized, and a silicon nitride film is deposited on the entire surface by the CVD method, and then an etch back by the RIE is carried out, leaving a spacer 28 including the silicon nitride film on the sidewall of the laminated film. Subsequently, the laminated film is used as a mask for introducing the impurity to selectively introduce the impurity, thereby forming diffusion regions which become the source and drain of the transistor in each of the first region and the second region. For example, n-type impurity such as phosphorus is introduced in the first region to form N-type diffusion regions 29, and n-type impurity is also introduced on the left part of the second region to form N-type diffusion regions 30. At the same time, the entire surface is covered with a protection film, for example, a resist film in the n-well region 13 of the second region. A p-type impurity, for example, boron, is selectively introduced in a portion of the n-well region 13 of the second region to form P-type diffusion regions 31. At the same time, the entire surface of the first region and the entire surface of the n-well region 13 are covered with protection films, for example, resist films.

Furthermore, n-type impurity with which the polycrystalline silicon film 21 of the trench capacitor 14 is doped is diffused into the p-well region 11 by heat treatment, to form diffusion regions 32. The diffusion regions 32 are integrated with the diffusion region 29 that becomes the source and drain of the memory cell transistor.

Next, as shown in FIG. 4A, FIG. 4B, a silicon nitride film 33 is deposited on the entire surface by CVD with a uniform film thickness, and then a silicon oxide film 34 is deposited by CVD. The thickness of the silicon oxide film 34 is such that a space between the gate electrodes 25 is sufficiently embedded in the first region.

Next, as shown in FIG. 5A, FIG. 5B, the silicon oxide film 34 is etched by the RIE until the silicon nitride film 33 on each of the gate electrodes 25 is exposed. This etching leaves the silicon oxide film 34 in the space between the gate electrodes 25 in the first region.

Subsequently, the entire surface of the first region is protected with a protection film, for example, a resist film, and the silicon oxide film 34 on the second region is removed by wet etching with an HF (hydrogen fluoride)-based solution, and then another silicon oxide film is deposited in the second region by CVD. Further, this silicon oxide film is etched-back by RIE so as to leave spacers 35 made of the silicon oxide film on the sidewall of the laminated film including the gate electrode 25. An upper portion of the silicon nitride film 33 is removed by the etch back during the formation of the spacers 35, so that there are exposed an upper surface of the cap insulating film 27 made of the silicon oxide film on each of the gate electrodes 25 and surfaces of the diffusion regions 30, 31 in the second region.

Figure 6A:
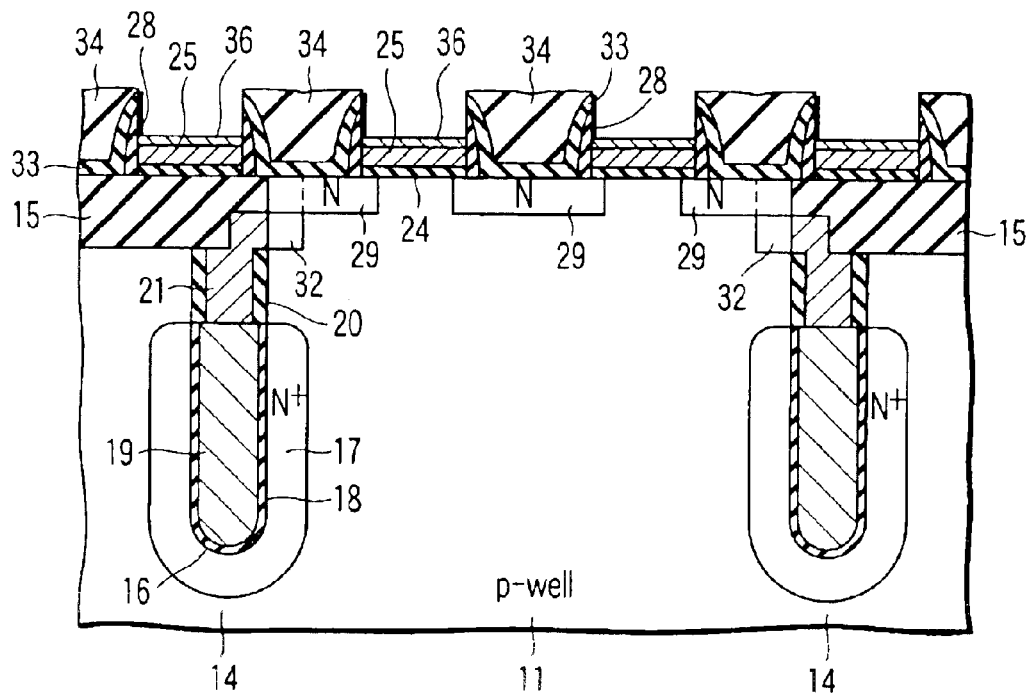
FIG. 6A and FIG. 6B are sectional views showing a manufacturing process following FIG. 5A and FIG. 5B.
Figure 6B:
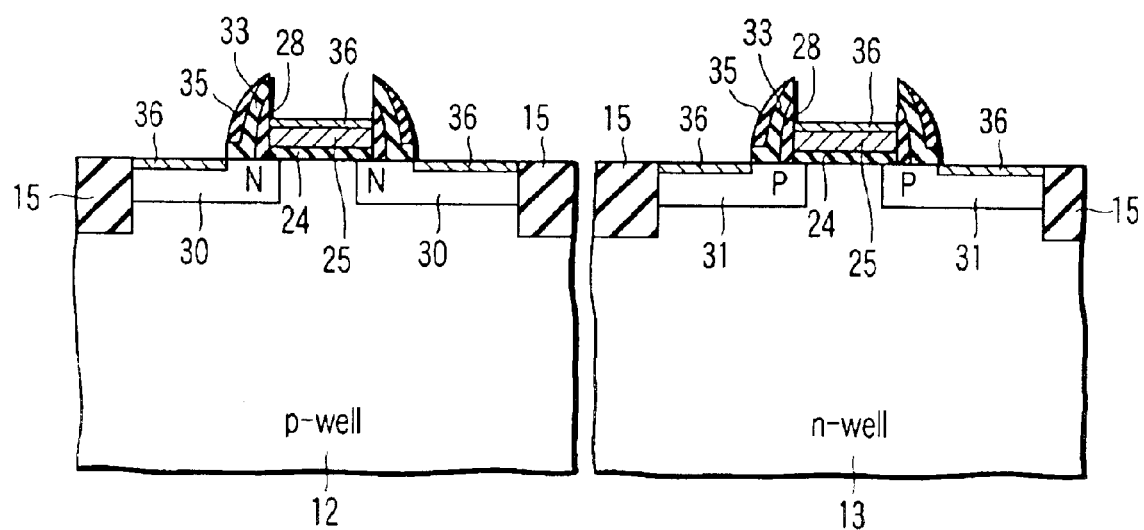

Next, as shown in FIG. 6A, FIG. 6B, the cap insulating films 27, thermal oxide films and CVD silicon oxide films 26 on the gate electrodes 25 are sequentially removed by the selective etching method, and thus a surface of each of the gate electrodes 25 is exposed. Subsequently, a self-aligned silicidation process is carried out, so that a metal silicide film 36 is formed on an upper surface of each of the gate electrodes 25, and the metal silicide films 36 are formed on upper surfaces of the diffusion regions 30, 31 in the second region. More specifically, a metal, for example, a cobalt film for forming silicide is deposited on the entire surface with a film thickness of about 30 nm by spattering, and then a heat treatment at about 550° C. is applied so as to form cobalt silicide on the silicon layer and on the polycrystalline silicon layer contacting the cobalt film.

Figure 7A:
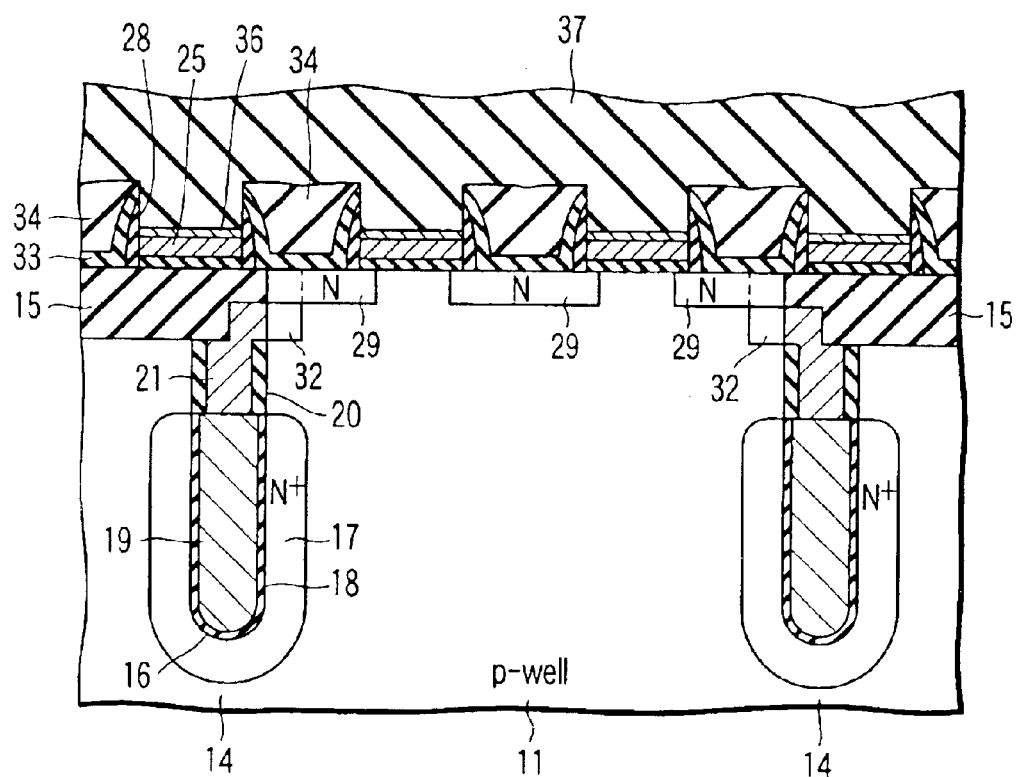
FIG. 7A and FIG. 7B are sectional views showing a manufacturing process following FIG. 6A and FIG. 6B.
Figure 7B:
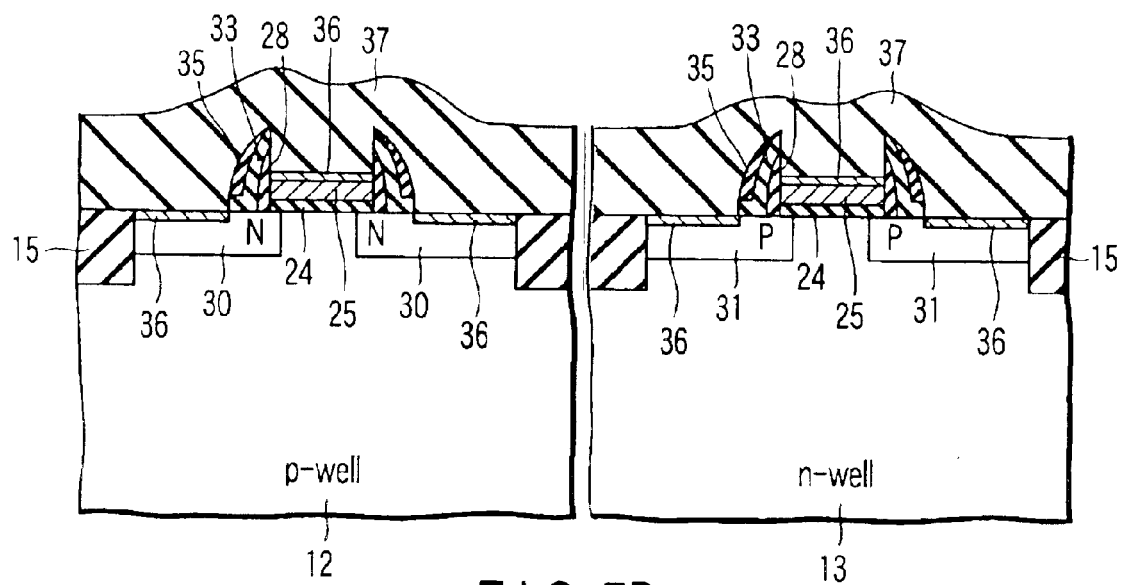

Next, as shown in FIG. 7A, FIG. 7B, a silicon nitride film 37 is deposited by CVD so that the space between the gate electrodes 25 is completely filled.

Next, as shown in FIG. 8A, FIG. 8B, the silicon nitride film 37 is etched-back by RIE, leaving the silicon nitride film 37 self-aligned on each of the gate electrodes 25 in the first region. In addition, the silicon nitride film 37 is left on the sidewall of each of the gate electrodes 25 in the second region. It should be noted that the treatment needs to be carried out at a low temperature such that the metal silicide film 36 does not agglutinate, during deposition and etching of the silicon nitride film 37.

Figure 9A:
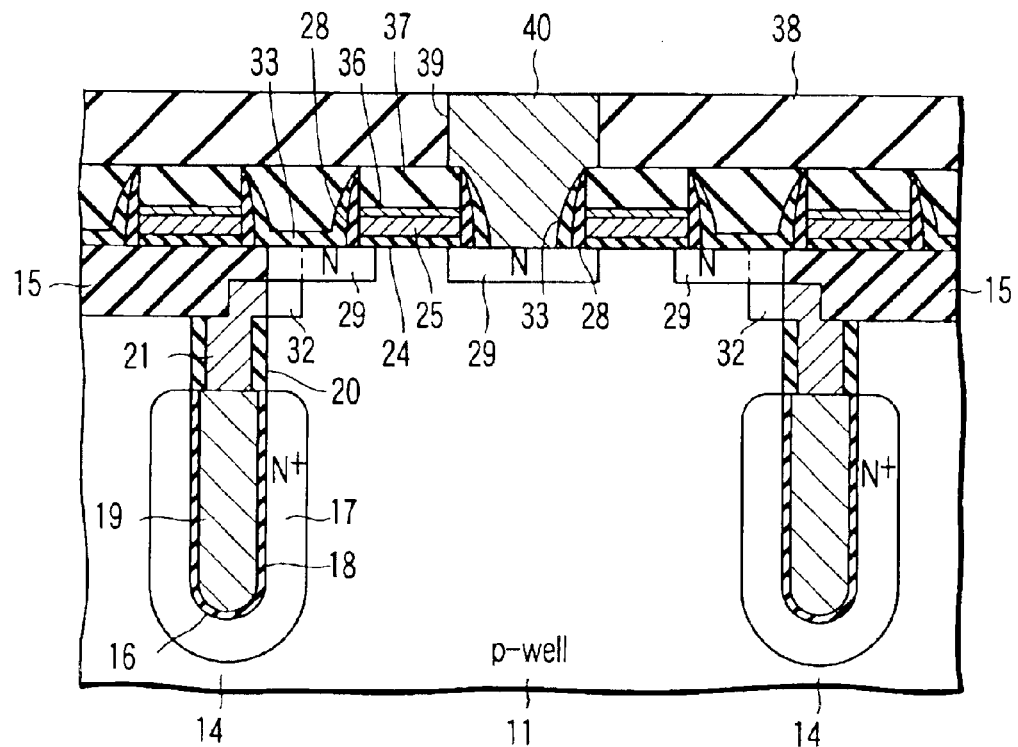
FIG. 9A and FIG. 9B are sectional views showing a manufacturing process following FIG. 8A and FIG. 8B.
Figure 9B:
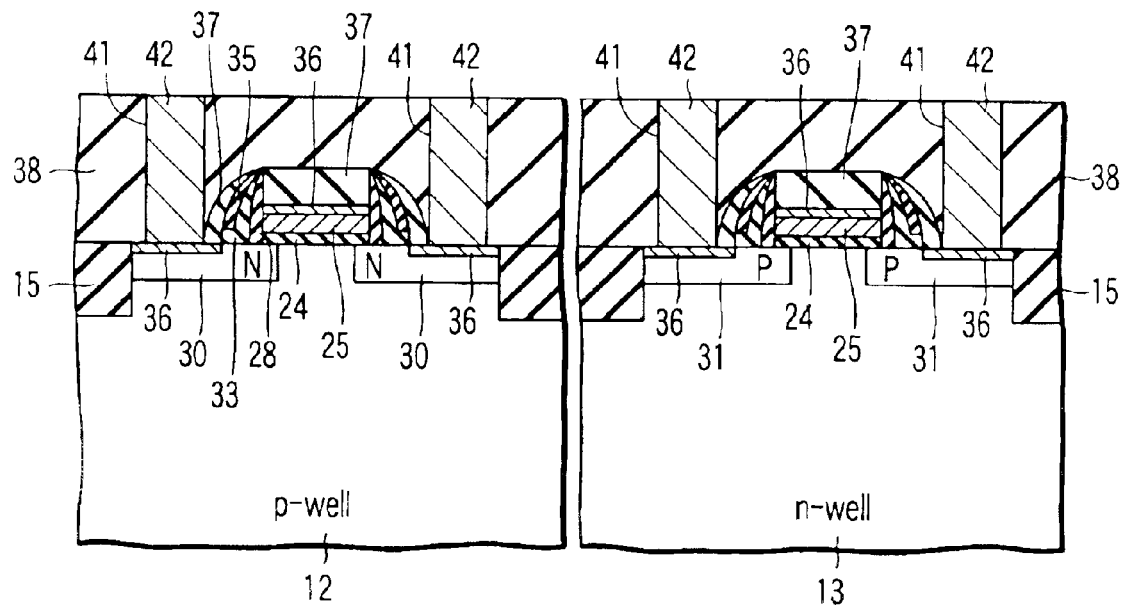

Subsequently, as shown in FIG. 9A, FIG. 9B, an interlayer insulation film 38 made of a silicon oxide film is deposited on the entire surface, and contact holes are opened in the interlayer insulation film 38 by the selective etching technique which is dependent on a condition under which the silicon oxide film is etched, and thus contacts (connection contacts) are formed.

More specifically, in the first region, the selective etching is applied to the interlayer insulation film 38 and silicon oxide film 34 so as to open a contact hole 39 that reaches a surface of the diffusion region 29 positioned between a pair of gate electrodes 25 adjacent to each other, and then a metal, for example, tungsten is embedded inside the contact hole 39 and flattened, thereby forming a contact 40. When the contact hole 39 is opened, the silicon nitride film 37 is present on the pair of gate electrodes 25, and the silicon nitride films 28, 33 are present on the sidewalls of the pair of gate electrodes 25. These silicon nitride films 37, 28, 33 are difficult to etch as compared with the silicon oxide film during the selective etching. Therefore, owing to the presence of the silicon nitride films 37, 28, 33, the contact hole 39 is opened self-aligningly with the gate electrode 25, so that the contact 40 becomes a self-aligned contact.

In the second region, the selective etching is applied to the interlayer insulation film 38 so as to open contact holes 41 that reach surfaces of the diffusion regions 30, 31 positioned on both sides of each of the gate electrodes 25, and then tungsten is embedded inside the contact holes 41 and flattened, thereby forming contacts 42.

In the second region, the metal silicide film 36 is formed respectively on the diffusion regions 30, 31 which become the source and drain and on the gate electrode 25 of the logic transistor, and on the gate electrode 25 of the memory cell transistor. As a result, resistance of the source, drain and gate electrodes can be reduced and high-speed operation can be achieved.

Furthermore, in the first region, the contact 40 is formed self-aligningly with the gate electrode 25 of the memory cell transistor.

In addition, gate processing is carried out simultaneously for the logic transistor and memory cell transistor, thereby making it possible to reduce the number of manufacturing processes.

It should be noted that, in the p-well region 11 shown in FIG. 9A, there are formed the pair of gate electrodes (first gate electrodes) 25 each made of a silicon conductor film which is provided via the gate oxide film (gate insulating film) 24; the N-type diffusion region (first diffusion region) 29 provided in the p-well region 11 between the pair of gate electrodes 25; the metal silicide films 36 (first metal silicide films) provided respectively on the upper surfaces of the pair of gate electrodes 25; the silicon nitride films (first silicon nitride films) 37 provided on the pair of gate electrodes 25 respectively; the silicon nitride films (second silicon nitride films) 28 provided respectively on the sidewalls of the laminated film constituted of the pair of gate electrodes 25 and the silicon nitride films 37; the silicon nitride film (third silicon nitride film) 33 provided on the silicon nitride film 28 so that the first diffusion region is exposed in a flat portion positioned between the pair of gate electrodes 25; and the self-aligned contact 40 provided between the pair of gate electrodes 25 and electrically connected to the diffusion region 29.

In the p- and n-well regions 12, 13 shown in FIG. 9B, there are formed the gate electrode (second gate electrode) 25 made of a silicon conductor film which is provided via the gate oxide film (gate insulating film) 24; the pair of N-type or P-type diffusion regions (second diffusion regions) 30, 31 formed in the p- or n-well regions 12, 13 positioned on both surfaces of the gate electrode 25; the metal silicide film (second metal silicide film) 36 formed on the upper surface of the gate electrode 25; the silicon nitride film (fourth silicon nitride film) 37 provided on the gate electrode 25; the silicon nitride film (fifth silicon nitride film) 28 provided on the sidewall of the laminated film constituted of the gate electrode 25 and the silicon nitride film 37; the silicon nitride film (sixth silicon nitride film) 33 provided on the silicon nitride film 28 so as to extend onto a portion of the surfaces of the diffusion regions 30, 31; the metal silicide films (third metal silicide films) 36 provided respectively on the surfaces of the diffusion regions 30 and 31 which are not covered with the silicon nitride film 33; the spacer (insulating film) 35 made of a silicon oxide film which is provided on the silicon nitride film 33; and the silicon nitride film (seventh silicon nitride film) 37 provided on the spacer 35.

In the semiconductor integrated circuit device thus configured, the metal silicide films 36 are formed respectively on the diffusion regions 30, 31 which become the source and drain and on the gate electrode 25 of the logic transistor, and on the gate electrode 25 of the memory cell transistor, so that the resistance of the source, drain and gate electrode can be reduced and high-speed operation can be achieved.

Furthermore, the contact 40 self-aligning with the gate electrode 25 of the memory cell transistor is formed.

It should be noted that the cobalt silicide film is used as the metal silicide film 36 in the embodiment described above, but a titanium silicide film, molybdenum silicide film or the like may be used instead thereof.

Furthermore, a case where the trench capacitor is formed in the first region has been described in connection with the above embodiment, but a stack capacitor may be formed instead.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method of manufacturing a semiconductor integrated circuit device comprising:

sequentially forming a gate insulating film, a conductor film containing silicon, and a cap insulating film containing a member capable of selectively etching a silicon nitride film in each of a first silicon semiconductor region and a second silicon semiconductor region;

patterning a laminated film constituted of the cap insulating film and the conductor film to form a gate electrode in each of the first and second silicon semiconductor regions;

using the laminated film as a mask for introducing impurity to selectively introduce the impurity so as to form source and drain diffusion regions in each of the first and the second silicon semiconductor regions;

forming a first silicon nitride film on a sidewall of each of the laminated films;

forming a second silicon nitride film on an entire surface;

depositing a first insulating film on the entire surface, and then leaving the first insulating film between the gate electrodes in the first silicon semiconductor region;

depositing a second insulating film in the second silicon semiconductor region, and then leaving the second insulating film on a sidewall of each of the laminated films in the second silicon semiconductor region;

removing the second silicon nitride film on each of the laminated films and the second silicon nitride film left on a surface of the second silicon semiconductor region;

removing the cap insulating film left above each of the gate electrodes;

forming a metal silicide film on a surface of the conductor film of each of the gate electrodes and forming a metal silicide film on each surface of the source and drain diffusion regions formed in the second silicon semiconductor region; and depositing a third silicon nitride film on the entire surface, and then leaving the third silicon nitride film on each of the gate electrodes.

2. The method according to claim 1, wherein when the gate electrodes are formed, a space between the gate electrodes formed in the second silicon semiconductor region is formed to be wider than a space between the gate electrodes formed in the first silicon semiconductor region.

3. The method according to claim 1, further comprising:

leaving the third silicon nitride film on each of the gate electrodes, and then depositing a third insulating film on the entire surface;

flattening the third insulating film;

selectively etching the third insulating film to expose the surface of the source and drain diffusion regions formed in the second silicon semiconductor region; and forming contact electrodes to connect with the surface of the source and drain diffusion regions.

4. The method according to claim 1, further comprising:

forming trench capacitors in the first silicon semiconductor region prior to sequentially forming the gate insulating film, the conductor film and the cap insulating film.

5. The method according to claim 1, wherein the conductor film is a polycrystalline silicon film into which the impurity is introduced.

6. The method according to claim 1, wherein the cap insulating film is formed by a chemical vapor deposition method.

7. The method according to claim 1, wherein the second silicon nitride film is formed by the chemical vapor deposition method.

8. The method according to claim 1, wherein the first insulating film is formed by the chemical vapor deposition method.

9. The method according to claim 1, wherein the first insulating film is etched-back by a reactive ion etching technique, thereby leaving the first insulating film between the gate electrodes in the first silicon semiconductor region.

10. The method according to claim 1, wherein the first silicon semiconductor region is a p-well region provided on a semiconductor substrate, and the second silicon semiconductor region includes p- and n-well regions provided on the semiconductor substrate.

11. A semiconductor integrated circuit device comprising:

a pair of first gate electrodes including a conductor film which are each provided via a gate insulating film in a first silicon semiconductor region;

a first diffusion region provided in the first silicon semiconductor region between the pair of first gate electrodes;

first metal silicide films provided on upper surfaces of the pair of first gate electrodes respectively;

first silicon nitride films provided on the pair of first gate electrodes respectively;

second silicon nitride films provided respectively on sidewalls of a laminated film constituted of the pair of first gate electrodes and the first silicon nitride films;

a third silicon nitride film provided on the second silicon nitride film so that the first diffusion region is exposed in a flat portion positioned between the pair of first gate electrodes;

a self-aligned contact provided between the pair of first gate electrodes and electrically connected to the diffusion region;

a second gate electrode including a conductor film which is formed in a second silicon semiconductor region via a gate insulating film;

a pair of second diffusion regions formed in the second silicon semiconductor region positioned on both surfaces of the second gate electrode;

a second metal silicide film formed on an upper surface of the second gate electrode;

a fourth silicon nitride film provided on the second gate electrode;

a fifth silicon nitride film provided on a sidewall of a laminated film constituted of the second gate electrode and the fourth silicon nitride film;

a sixth silicon nitride film provided on the fifth silicon nitride film so as to extend onto a portion of the surface of the pair of second diffusion regions;

third metal silicide films provided respectively on the surfaces of the pair of second diffusion regions which are not covered with the sixth silicon nitride film;

an insulating film provided on the sixth silicon nitride film; and a seventh silicon nitride film provided on the insulating film.

12. The semiconductor integrated circuit device according to claim 11, wherein trench capacitors are formed in the first silicon semiconductor region.

13. The semiconductor integrated circuit device according to claim 11, wherein the conductor film is a polycrystalline silicon film into which an impurity is introduced.

* * * * *